United States Patent [19]

Kondo

[11] Patent Number: 4,570,569
[45] Date of Patent: Feb. 18, 1986

[54] SOLDERING APPARATUS

[75] Inventor: Kenshi Kondo, Tokyo, Japan

[73] Assignee: Nihon Den-Netsu Keiki Co., Ltd., Tokyo, Japan

[21] Appl. No.: 670,941

[22] Filed: Nov. 13, 1984

[30] Foreign Application Priority Data

Nov. 14, 1983 [JP] Japan .................. 58-212358
Nov. 14, 1983 [JP] Japan .................. 58-212359
Nov. 14, 1983 [JP] Japan .................. 58-212360

[51] Int. Cl.[4] .................................... B05C 3/02
[52] U.S. Cl. ............................. 118/410; 118/74; 118/423; 118/500; 228/39
[58] Field of Search ............... 118/74, 410, 423, 424, 118/500; 228/37, 39

[56] References Cited

U.S. PATENT DOCUMENTS 3,004,505 10/1961 Dvorak ................. 118/410
4,401,253 8/1983 O'Rourke ............. 228/37 X
4,512,508 4/1985 Pachschwoll ......... 228/37 X

FOREIGN PATENT DOCUMENTS 53-32854 3/1978 Japan ..................... 228/37

Primary Examiner—Shrive P. Beck
Attorney, Agent, or Firm—Stephen F. K. Yee

[57] ABSTRACT

An apparatus for automatically coating terminal leads of electrical components such as IC with solder for improving solderability thereof. A plurality of IC stored in a row within a container placed at a predetermined feed location are automatically fed onto a track extending adjacent to a series of work stations arranged in a straight path and including a soldering station in which IC are contacted with a solder wave. Driving means is provided for displacing along the track the row of IC fed thereon. The worked IC are automatically collected within an empty container placed at a predetermined receipt location.

7 Claims, 15 Drawing Figures

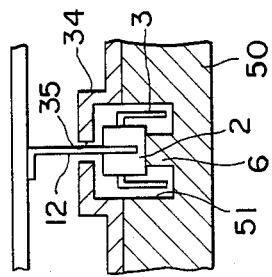
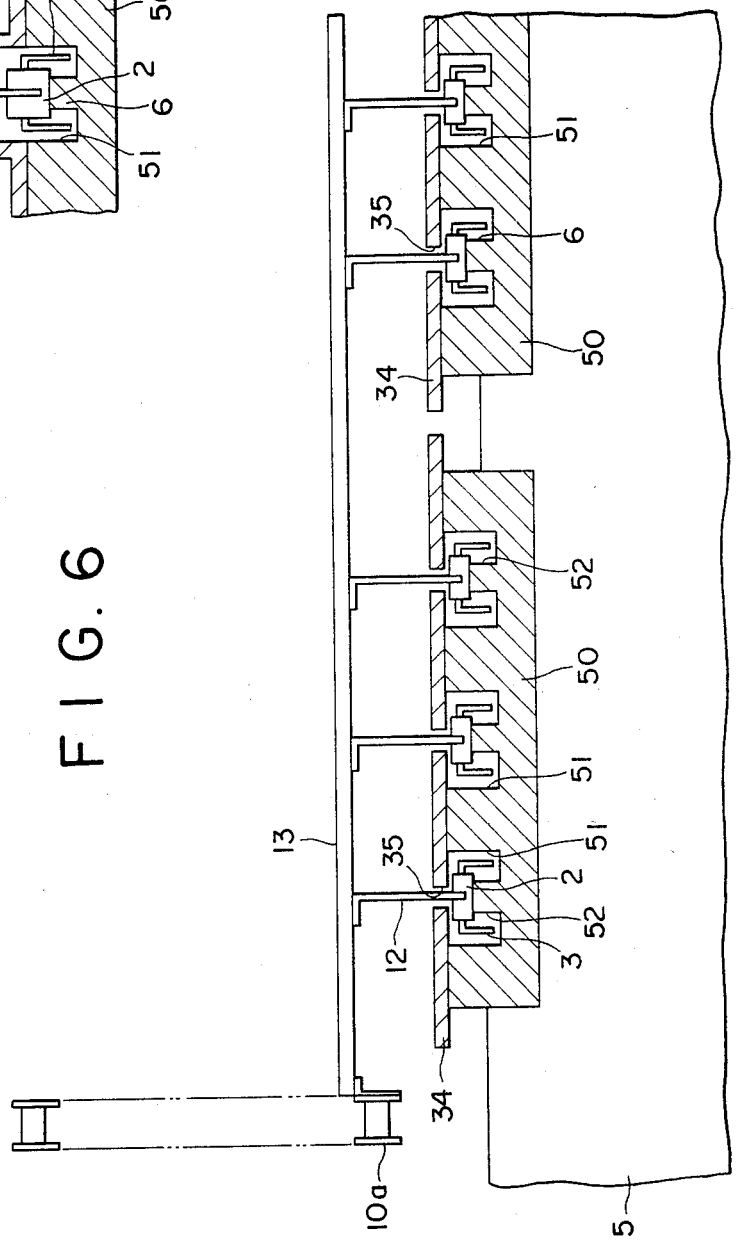

SOLDERING APPARATUS

BACKGROUND OF THE INVENTION

This invention relates generally to a soldering apparatus. More particularly, the present invention is directed to an apparatus for coating terminal leads of electrical components such as integrated circuits (IC) with solder.

As well known, before being mounted on printed circuit boards, electrical components to be joined to the circuits of the printed circuit boards are desired to be pretreated for coating their terminal leads with solder and for improving solerability thereof. Such a pretreatment has thus so far been effected by a method including manually mounting the electrical components one by one on a holder plate, and manually loading the electrical components-carrying holder plate on a carrier of an automatic soldering apparatus. After soldering, the holder plate is unloaded and the electrical components with their terminal leads coated with solder are removed manually therefrom. Thus, the conventional method is time consuming and requires many hands.

SUMMARY OF THE INVENTION

It is, therefore, the prime object of the present invention to provide an apparatus for automatically coating terminal leads of electrical components, especially integrated circuits (IC), with solder.

In accomplishing the foregoing object, there is provided in accordance with the present invention an apparatus for coating terminal leads of electrical components with solder, comprising:

at least one pair of container means each having a support member adapted for supporting thereon a plurality of electrical components in a row;

a series of work stations including a soldering station wherein the terminal leads of each electrical component are brought into contact with molten solder, said stations being arranged in a straight path and having track means extending adjacent thereto, corresponding in number to the number of said pair and adapted for supporting the electrical components thereon in a manner so that the electrical components placed thereon can be displaced therealong when urged in the direction parallel to the track means;

a first platform provided adjacent to one end of said track means and adapted for supporting thereon respective one of the container means of each pair at a feed location;

first operating means for operating the row of electrical components on the support member of each container means placed at said feed location on said first platform to displace the row of electrical components to a start position on associated track means;

moveable rail means provided adjacent to the other end of said track means, adapted for supporting thereon the electrical components and each moveable between a first position at which the row of electrical components on associated track means may be transferred thereon and placed at a terminal position;

driving means for displacing the row of electrical components supplied at the start position on each track means through the series of work stations to the terminal position on associated moveable rail means postioning at said first position;

a second platform provided adjacent to said moveable rail means and adapted for supporting thereon the other one of container means of each pair at a receipt location; second operating means for operating the row of electrical components supplied at the terminal position on each moveable rail means at said second position to displace same on the support member of associated container means placed at said receipt location on said second platform; and means for displacing said moveable rail means between said first and second positions.

BRIEF DESCRIPTION OF THE DRAWINGS

Other objects, features and advantages of the present invention will become apparent from the detailed description of the preferred embodiments of the invention which follows, when considered in light of the accompanying drawings, in which:

FIG. 6 is a cross-section taken on line VI—VI in FIG. 5;

FIG. 7 is a partial, cross-sectional view, similar to FIG. 6, diagrammatically showing an alternative embodiment of a cover plate;

DESCRIPTION OF THE PREFERRED EMBODIMENTS

Figure 1:
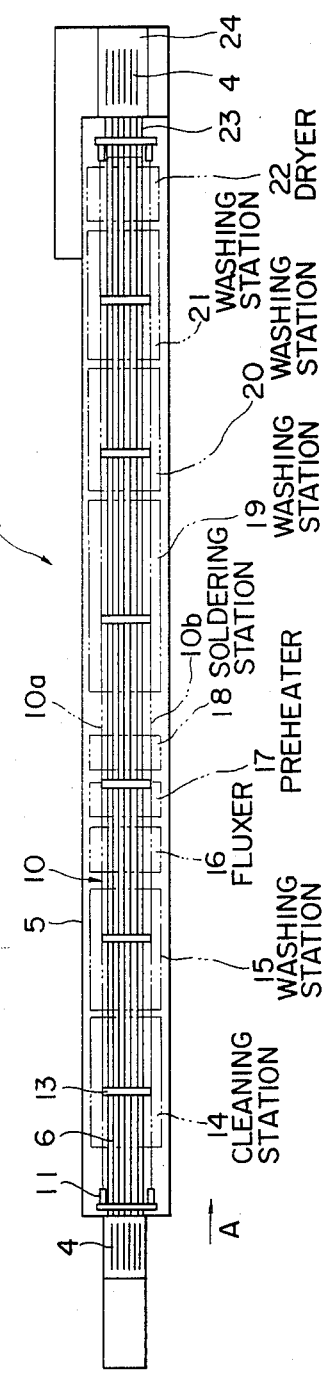
FIG. 1 is a plan view schematically showing one embodiment of soldering apparatus according to the present invention.
Figure 2:
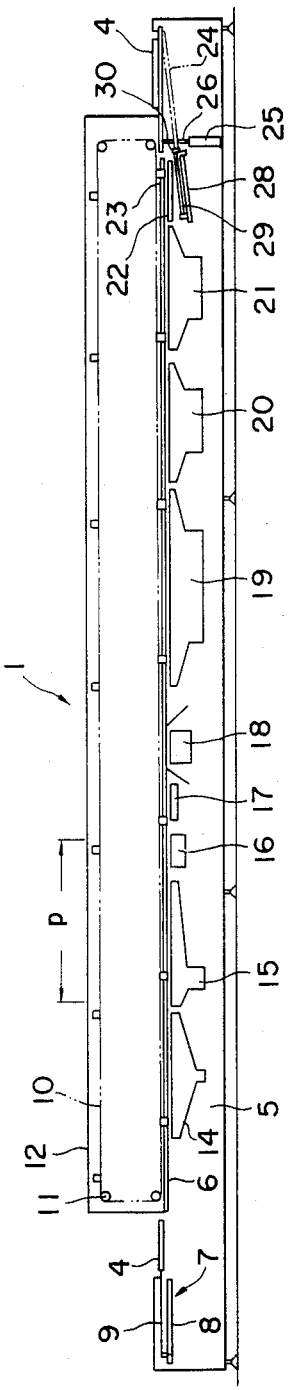
FIG. 2 is a schematic, elevational view of FIG. 1.

Referring now to FIGS. 1 and 2, designated generally by the reference numeral 1 is soldering apparatus according to the present invention. The apparatus 1 has a series of work stations such as a cleaning station 14 in which IC supplied thereto in a manner described hereinafter are washed with an acid solution for the removal of stains deposited on their terminal leads, a washing station 15 in which IC are washed with water for the removal of the acid solution, a fluxing station 16 in which IC are applied with a flux, a preheating station 17 for heating IC, a soldering station 18 in which the terminal leads of IC are brought into contact with a molten solder, generally a solder wave, washing stations 19, 20 and 21 and a drying station 22.

The work stations 14 to 22 are mounted on a base frame 5, arranged in a straight path and have one or more (6 in number, in the specific embodiment shown) track means 6 extending in parallel with each other adjacent to the path. As described in detail hereinafter, each IC is slidably supported on the track means 6 and is transferred thereon by driving means 10 through the series of work stations 14 to 22.

FIG. 6 shows a preferred embodiment of the track means 6 according to the present invention. Extending adjacent to the work stations 14 to 22 are one or more (two in the illustrated case) transfer plates 50 each having one or more (three in the illustrated case) longitudinally extending parallel grooves 51. Each groove 51 has a longitudinally extending raised portion 52 serving as the track 6. Cover plates 34 extend above the grooves 51 for covering the open top of each groove 51 and are arranged so that slits 35 are formed between adjacent cover plates 34. Each slit extends along the central axis of the track 6 and serves as a guide for the movement of an engaging member 12 for displacing IC as hereinafter described. FIG. 7 shows an alternate embodiment of the cover plates 34. Each cover plate 34 is bent at the groove 51 so as to cover the track 6 supporting thereon IC of a large size.

Figure 3:
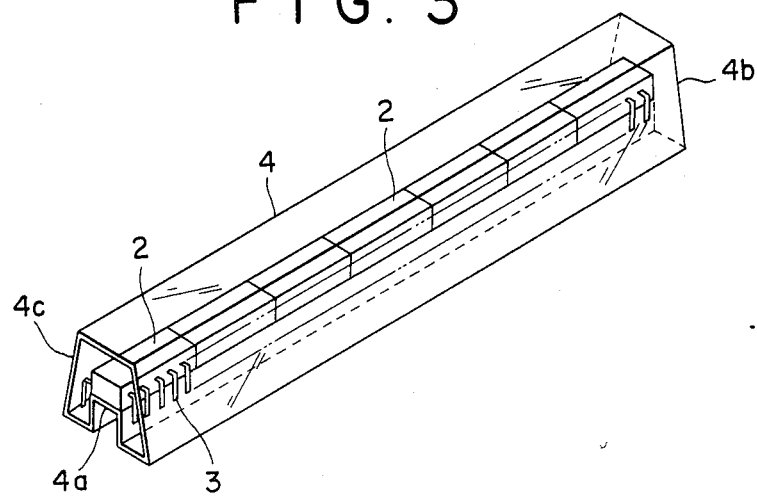
FIG. 3 is a perspective view diagrammatically showing a container storing IC arranged in a row.

Referring to FIG. 3, the reference numeral 4 denotes container means, preferably an elongated, transparent plastic case, for storing a plurality of IC 2 thereon. The container 4 has a longitudinally extending support member 4a on which IC 2 are slidably moveably supported contiguously in a row with their terminal leads 3 being oriented downwardly. The opposite ends 4b and 4c of the container 4 are open ended so that by pushing the rear end of the IC at the trailing end of the row of IC in the longitudinal direction by, for example, a push rod from the rear open end 4b, the row of IC can be displaced and discharged from the fore end 4c of the container 4.

Figure 4:
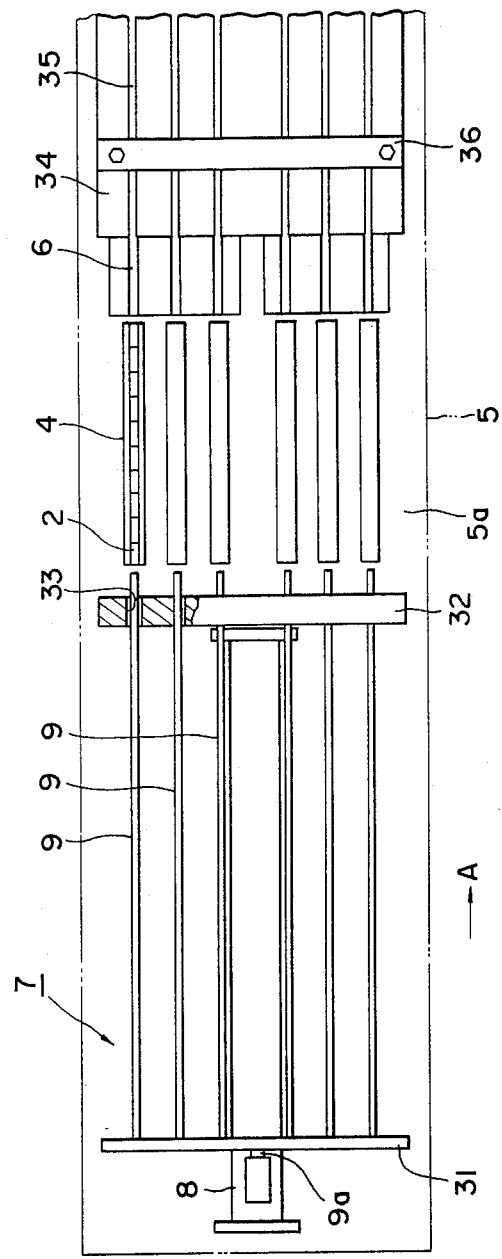
FIG. 4 is a fragmentary, enlarged plan view, cut away in part, diagrammatically showing the feeding arrangement of FIG. 1.

FIG. 4 depicts a preferred embodiment of an arrangement for feeding IC 2 stored in the container 4 to the track means 6. The base frame 5 has, adjacent to one end of the track means 6, a first station 5a for supporting thereon one or more containers corresponding in number to the number of the track means 6 at a feed location. In the feed location, the support member 4a of each container 4 is maintained in alignment with and at the same level as its associated track means 6 so that the row of IC in the container 4 may be transferred to its associated track means 6 when the rear end of the IC at the trailing end is pushed out from the container 4.

Figure 5:
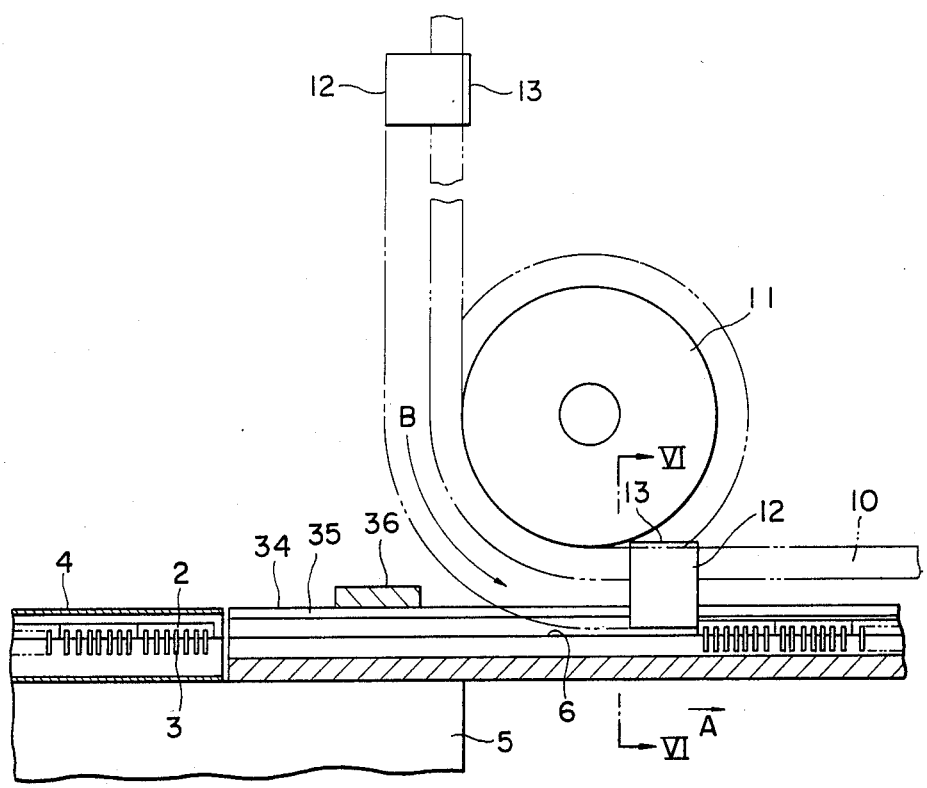
FIG. 5 is a fragmentary, enlarged, cross-sectional, elevational view diagrammatically showing the driving mechanism for transferring a row of IC along a track.

Operaing means 7 is provided adjacent to the feed location to displace the row or rows of IC 2 in the container or containers 4 positioning at the feed location to the associated track menas 6. Operating means 7 in the illustrated embodiment includes an air cylinder 8 having an actuation rod 9a to which is fixed a connector 31. One or more operating rods 9 corresponding in number to the number of the tracks 6 are secured to the connecter 31. Provided adjacent to the first station 5a is a guide member 32 with through holes 33 corresponding in number to the number of the rods 9 for slidably receiving therein the operating rods 9. Thus, in the illustrated state in which the operating rods 9 are in retracted position, when the air cylinder 8 is actuated, the operating rods 9 come into engagement with the rear ends of the IC and then push the rows of IC in the direction shown by the arrow A. When the operating rods 9 are moved to the extended position, the row of IC in each container 4 is displaced to its associated track means 6 and positioned in a start position as shown in FIG. 5. The rows of IC supplied to the start position are then transferred by the driving means 10 along respective track means 6 intermittently with a predetermined interval.

As shown in FIGS. 1 and 2, the drive means 10 includes a pair of laterally spaced apart endless chains 10a and 10b which are in mesh with drive and idler sprockets 11 and which are simultaneously driven periodically. A plurality of equally spaced apart support plates 13 extends transversely between the pair of endless chains 10a and 10b and are fixed there. As shown in FIG. 6, each support plate 13 has one or more engaging members 12 corresponding in number to the number of the track means 6 and disposed so that the engaging member 12 may travel adjacent to respective track means 6 upon the actuation of the endless chains 10a and 10b with its front edge being maintained in engagement with the rear end of the IC of the trailing end of each row.

The distance P between adjacent support plate 13 is greater than the length of the row of IC contained in the container 4 and is equal to the distance through which the endless chains 10a and 10b move in each period.

FIG. 5 illustrates the state in which the engaging member 12 has just come into engagement with the rear end of the IC of the trailing end of the row located at the start position. Upon further movement of the chains 10a and 10b, the row of IC is displaced to the cleaning station 14 and stops there for a predetermined period of time for undergoing the cleaning treatment with the acid solution. During the stop period, the next row of IC in the container subsequently placed at the feed location is displaced to the start position on the track means 6. After lapse of the stop period, the row of IC in the cleaning station is transferred to the next washing station 15 while the row of IC in the start position is displaced to the cleaning station 14. The removal of the empty container 4 from the feed location on the first station 5a and the placement of the new IC-carrying container 4 on the feed location may be manually effected but is preferably done automatically using, for example, a belt conveyor.

The rows of IC worked during the travel through the series of work stations are automatically collected in empty containers 4 at the downstream end of the track means 6. A moveable rail 23, which is moveable between a first position as shown in the solid line in FIG. 8 in which the rail 23 is in alignment with the track means 6 and a second position as shown in the two-dotted line, is disposed adjacent to the downstream end of each of the track means 6 so that the row of IC carried by the engaging member 12 is transferred to the moveable rail 23 located in the first position. The engagement between the engaging member 12 and the rear end of the IC at the trailing end of the row is dissolved upon a further movement of the engaging member 12 in the direction shown by the arrow E to leave the row of IC at a terminal position on the moveable rail 23.

Figure 8:
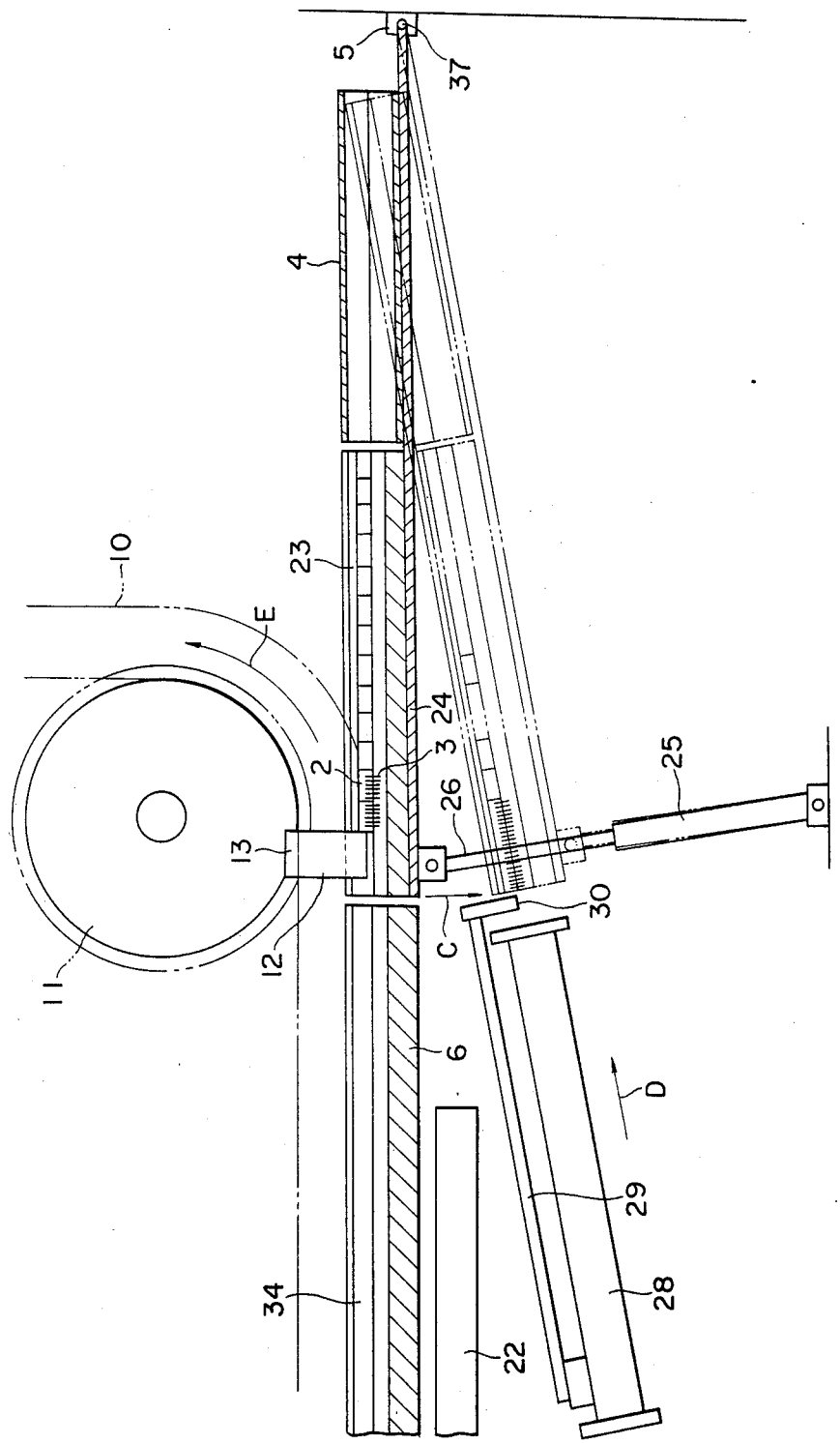
FIG. 8 is a partial, cross-sectional, elevational view diagrammatically showing the delivery arrangement of FIG. 1.

The moveable rail 23 in the embodiment shown in FIG. 8 is fixedly provided on a second station 24 having its one end pivotally secured to the base frame 5. The other end of the station 24 is connected to the end of an operating rod 26 of an air cylinder 25, so that the station 24 is rotatable about the pivot 37 by the actuation of the air cylinder 25, thereby positioning the moveable rail 23 between the first position when the operating rod is in the extended state and the second position when the rod 26 is in the retracted state.

The second station 24 has a receipt location on which empty container or containers 4 corresponding in number to the number of the track 6, i.e. moveable rails 23, are placed and in which rails are in alignment with the associated containers 4. An air cylinder 28 is disposed adjacent to the rails for displacing the row of IC placed on each rail 23 to the empty container 4 placed at the receipt location on the station 24. The air cylinder 28 has an operating rod 29 whose edge is provided with an engage plate 30 adapted for engagement with the rear end of the IC at the trailing end of the row placed on the rail 23 in the second location as shown by the two-dotted line in FIG. 8.

In operation, after the row of IC carried by each engaging member 12 is placed at the terminal position on the moveable rail 23, the air cylinder 25 is actuated to retract the rod 26 to rotate the station 24 and to displace the moveable rail 23 in the second position. Then the air cylinder 28 is actuated to displace the row of IC on the rail 23 to the empty container 4 placed on the receipt location of the station 24. Then the rod 29 of the air cylinder 28 is retracted and the moveable rail 23 is displaced to the first position by the action of the air cylinder 25. The container 4 thus storing the worked IC is then replaced with an empty container manually or automatically.

Figure 9:
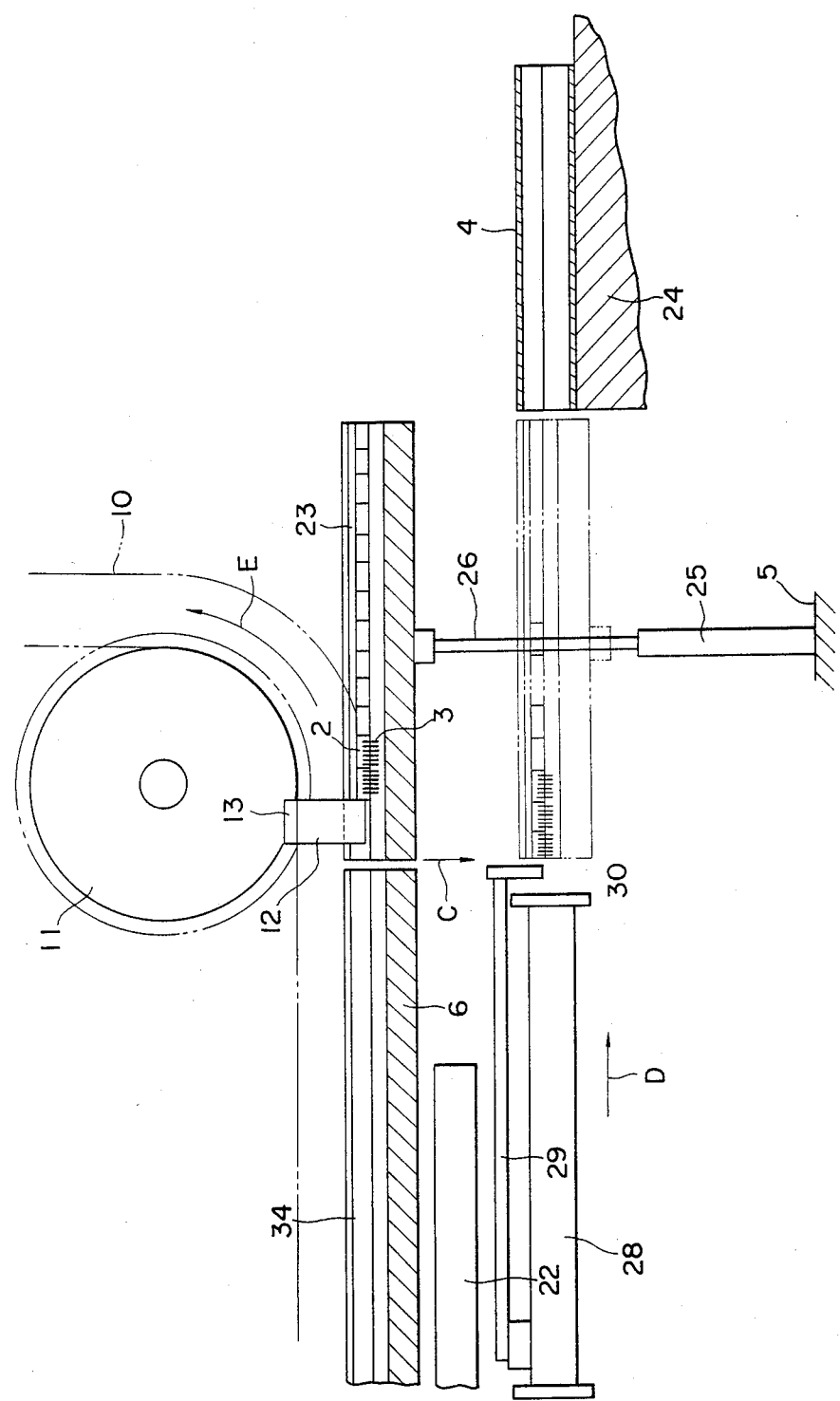
FIG. 9 is a partial, cross-sectional, elevational view diagrammatically showing an alternative embodiment of the delivery arrangement.

FIG. 9 shows an alternate embodiment of the arrangement for automatically collecting worked IC, wherein the empty containers 4 are on a stationary station 24 and a moveable rail 23 is vertically displaced between the first position shown by the solid line and the second position shown by the two-dotted line. In the first position, the moveable rail 23 is in alignment with the track means 6 so that the row of IC can be transferred from the track 6 to the rail 23 and can position at a terminal position by the displacement of the engaging member 12. In the second position, the moveable rail is in alignment with the container placed on the station 24 at the receipt location, so that the row of IC on the rail 23 can be displaced to the container 4 when pushed in the direction shown by the arrow D by an operating rod 29 of an air cylinder 28.

Figure 10:
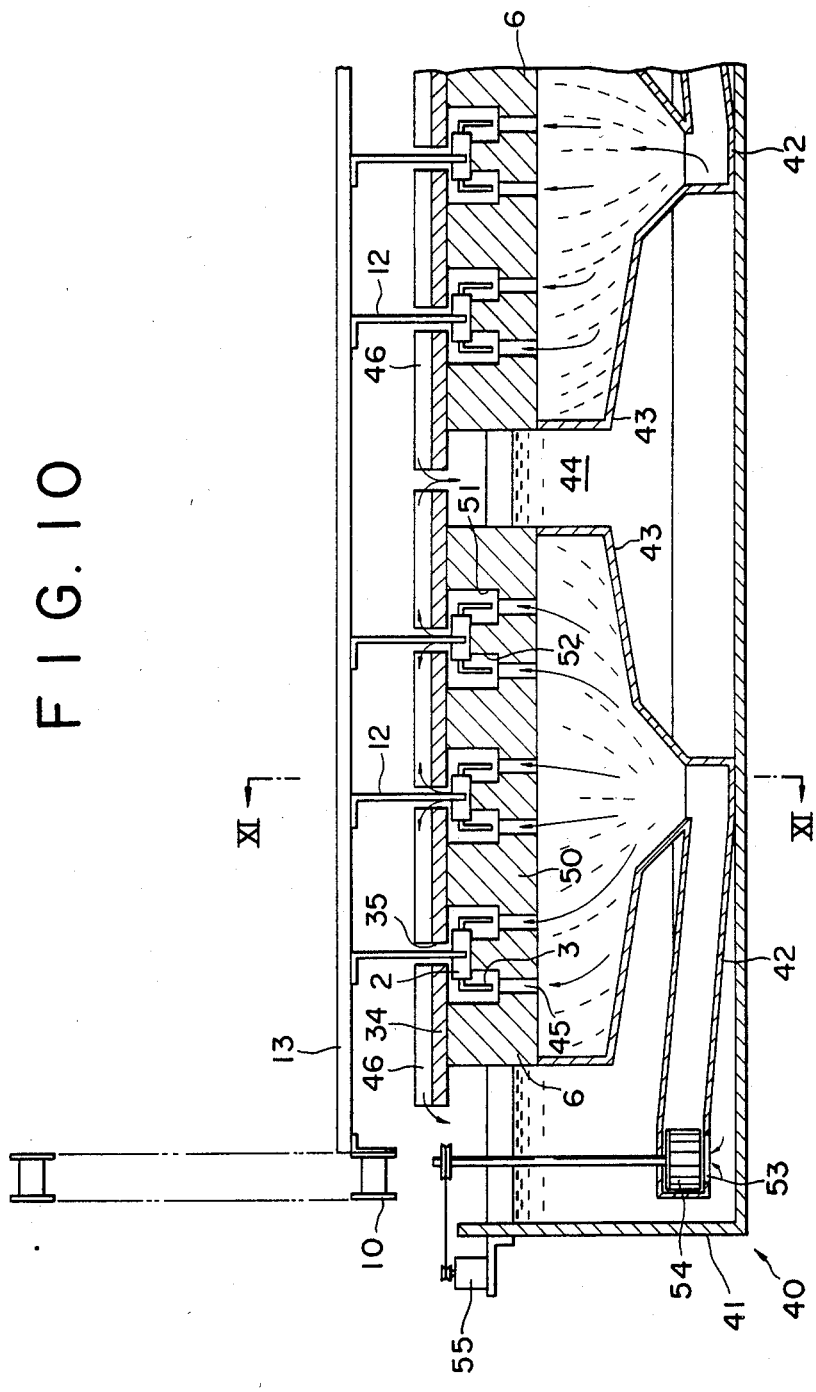
FIG. 10 is a cross-sectional, fragmentary, elevational view diagrammatically showing an embodiment of the acid-treating station of FIG. 1.
Figure 11:
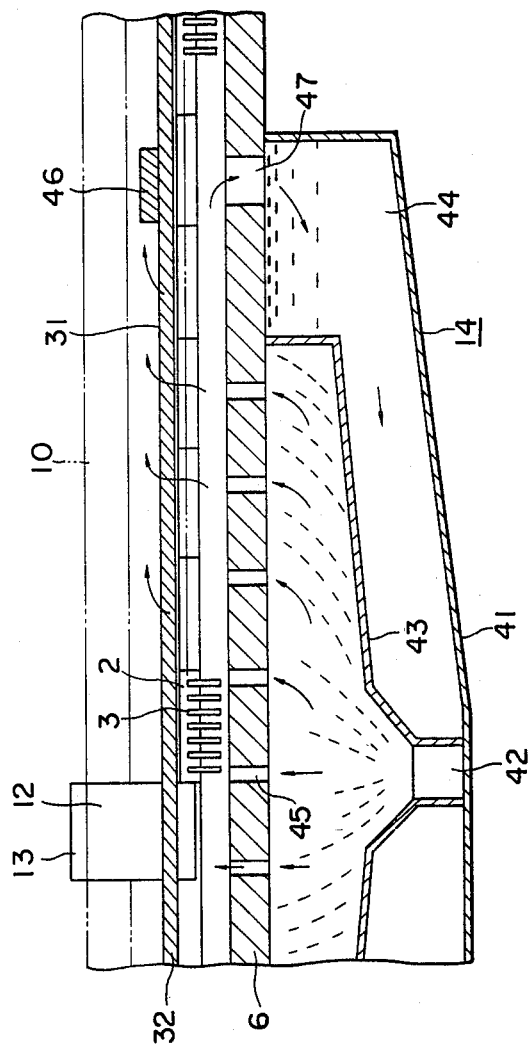
FIG. 11 is a fragmentary, cross-section taken on line XI—XI of FIG. 10.
Figure 12:
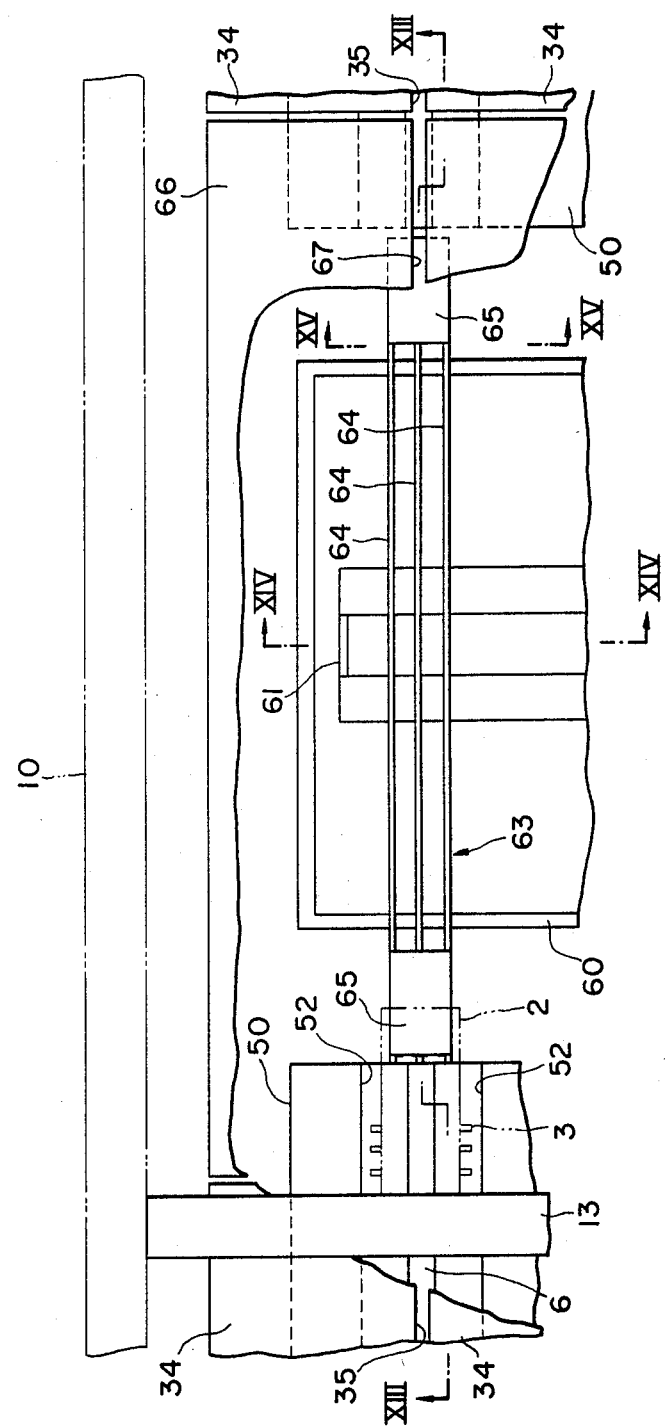
FIG. 12 is an enlarged, fragmentary plan view, cut away in part, diagrammatically showing an embodiment of the soldering station of FIG. 1.
Figure 13:
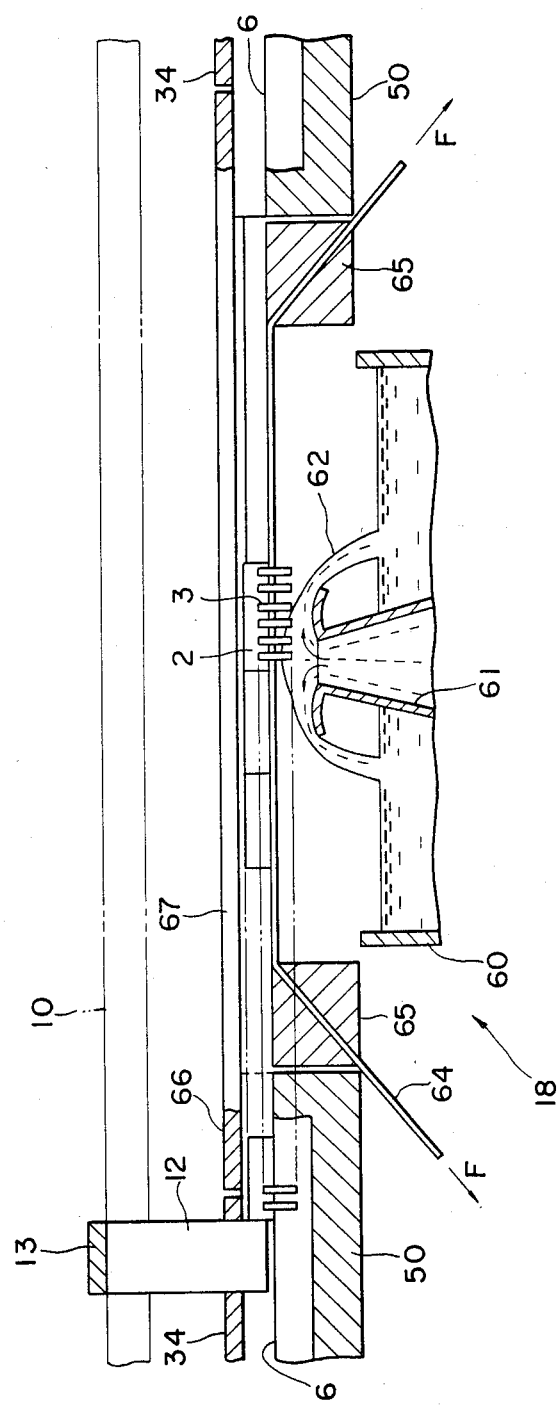
FIG. 13 is a partial, cross-section taken on line XIII—XIII in FIG. 12.
Figure 14:
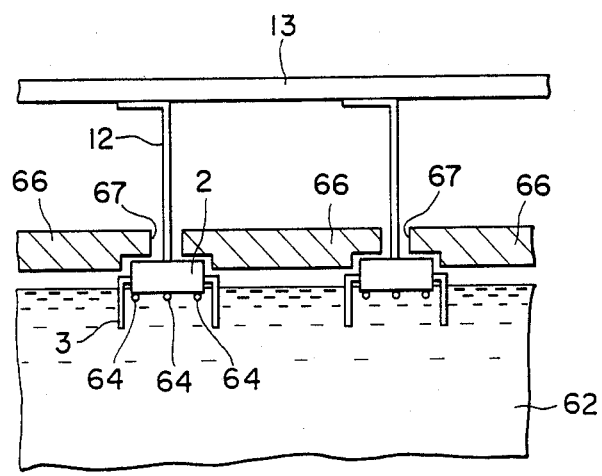
FIG. 14 is a cross-section taken on line XIV—XIV in FIG. 12.
Figure 15:
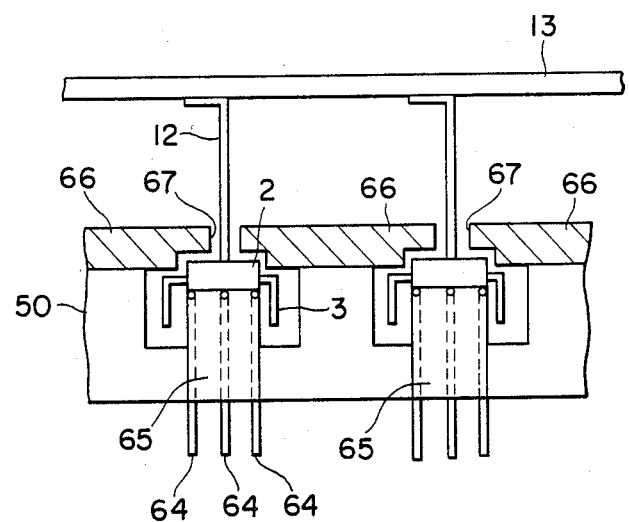
FIG. 15 is a cross-section taken on line XV—XV in FIG. 12.

FIGS. 10 and 11 illustrate an embodiment for contacting means 40 for contacting the terminal leads of IC with a liquid such as a flux, an acid solution or hot water. Such a contacting means is suitably used for washing stations 14, 15 19, 20 and 21 and the fluxing station 16. The contacting means 40 includes an outer, open-topped vessel 41 with a rectangular cross-section for containing a liquid 44 and an inner open-topped vessel 43 having a rectangular cross-section and disposed within the outer vessel 41. Connected to the bottom of the inner vessel 43 is one end of a conduit 42 which is provided with an opening 53 at the other end thereof. A rotating propeller 54 which is driven by a motor 55 is provided in the conduit 42 at a position over the opening 53. Upon rotation of the propeller 54 by the motor 55, the liquid in the outer vessel 41 is sucked into the conduit 42 and is fed into the inner vessel 43.

The open top of the inner vessel 43 is covered with a transfer plate 50 similar to that of FIG. 6. The plate 50 is provided with a plurality of perforations 45 so that each groove 51 of the plate 50 is in fluid communication with the inner vessel 43. The plate 50 has an opening 47 so that the groove 51 is also in fluid communication with the outer vessel 41. Thus, the liquid supplied through the conduit 42 within the inner vessel 43 flows upward through the perforations 45 into the groove 51, whereby the terminal leads 3 of IC 2 are contacted with the liquid. The liquid in the groove 51 is then returned within the outer vessel 41 through the opening 47. A portion of the liquid in the groove 51 flows out from the groove 51 through the slits 35 between the cover plates 34 and the overflown liquid is then returned within the outer vessel 41. Designated as 46 are dams for preventing the liquid flow thereover.

FIGS. 12 through 15 illustrate a preferred embodiment of the soldering station 18. The soldering station 18 includes a vessel 60 for containing molten solder and a nozzle 61 which is disposed within the vessel 60 and from which a molten solder is overflown to form a solder wave 62 in a manner known per se. The transfer plate 50 is deleted at the soldering station 18 and is replaced with one or more wire rail means 63 corresponding in number to the number of the track means 6. Each wire rail means 63 in the illustrated embodiment includes three parallel strings, such as piano wires 64, tightly extending between a pair of supports 65 fixed on the base frame 5 not shown. The opposite ends of the strings 64 are normally stretched in the direction as shown by the arrow F to prevent loosening of the wire rails 63 due to thermal expansion thereof. Above the wire rail means 63, cover plates 66 are so disposed as to define slits 67 extending just above the wire rails and serving as a guide for the movement of the engaging member 12.

In the solder station 18, each row of IC from the previous work stations is transferred on the support 65 and then displaced on the wire rail means 63. Above the nozzle 61, the terminal leads of each IC are contacted with the solder wave 62 and covered with the solder. The resultant IC are then passed to the succeeding work stations and collected in empty containers as described previously.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

I claim:

1. An apparatus for coating terminal leads of electrical components with solder, comprising:
   at least one pair of container means each having a support member adapted for supporting thereon a plurality of electrical components in a row;
   a series of work stations including a soldering station wherein the terminal leads of each electrical components are brought into contact with molten solder, said stations being arranged in a straight path and having track means extending adjacent thereto, corresponding in number to the number of said pair and adapted for supporting the electrical components thereon in a manner so that the electrical components placed thereon can be displaced therealong when urged in the direction parallel to the track means;
   a first platform provided adjacent to one end of said track means and adapted for supporting thereon respective one of the container means of each pair at a feed location;

first operating means for operating the row of electrical components on the support member of each container means placed at said feed location on said first platform to displace the row of electrical components to a start position on associated track means;

moveable rail means provided adjacent to the other end of said track means, adapted for supporting thereon the electrical components and each moveable between a first position at which the row of electrical components on associated track means may be transferred thereto and placed at a terminal position;

driving means for displacing the row of electrical components supplied at the start position on each track means through the series of work stations to the terminal position on associated moveable rail means positioning at said first position;

a second platform provided adjacent to said moveable rail means and adapted for supporting thereon the other one of container means of each pair at a receipt location;

second operating means for operating the row of electrical components supplied at the terminal position on each moveable rail means at said second position to displace same on the support member of associated container means placed at said receipt location on said second platform; and means for displacing said moveable rail means between said first and second position.

2. An apparatus as claimed in claim 1, wherein said driving means includes a pair of moveable endless chains disposed in parallel with and in the opposite sides of said straight path, means for intermittently moving said endless chains, one or more supporting plates transversely extending between and secured to said endless chains for moving therewith, and one or more engaging members mounted to each of said support plates and corresponding in number to the number of said track means so that each engaging member travels adjacent to corresponding one of said track means, whereby a row of electrical components placed on each track means may be displaced thereon with the rear end of the electrical components positioning at the trailing end being maintained in engagement with the engaging member.

3. An apparatus as claimed in claim 2, further comprising one or more transfer plates extending adjacent to said straight path and each having a longitudinally extending grooves, each groove having a raised portion extending longitudinally along said groove and serving as said track means.

4. An apparatus as claimed in claim 3, further comprising cover plates arranged to cover said grooves and to form a slit between each adjacent two cover plates, said engaging members being displaced and guided by respective slits.

5. An apparatus as claimed in claim 4, wherein said series of work stations includes a contacting station in which electrical components are contacted with a liquid and which includes an outer, open-topped vessel for containing said liquid, an inner, open-topped vessel disposed within said outer vessel and having its open end covered with said transfer plates, a plurality of perforations formed in said cover plates so that the grooves of said cover plates are in fluid communication with said inner vessel, through holes provided in said cover plates so that the grooves are in fluid communication with said outer vessel, and means for directing the liquid in said outer vessel to said inner vessel, whereby the liquid introduced in said inner vessel flows into said grooves through said perforations and returns within said outer vessel through said through holes with a portion of the liquid in said grooves overflowing through said slits over said cover plates and returning within said outer vessel.

6. An apparatus as claimed in claim 4, wherein said soldering station includes means for forming a solder wave with which the terminal leads of the electrical components engage.

7. An apparatus as claimed in claim 6, wherein said transfer plates are deleted in said soldering station and substituteed with wire rails disposed as said track means.

* * * * *